United States Patent
Vlassiouk et al.

(10) Patent No.: US 10,023,468 B2
(45) Date of Patent: Jul. 17, 2018

(54) HIGH QUALITY LARGE SCALE SINGLE AND MULTILAYER GRAPHENE PRODUCTION BY CHEMICAL VAPOR DEPOSITION

(71) Applicant: UT-Battelle, LLC, Oak Ridge, TN (US)

(72) Inventors: Ivan V. Vlassiouk, Oak Ridge, TN (US); Sergei N. Smirnov, Las Cruces, NM (US); William H. Peter, Knoxville, TN (US); Adrian S. Sabau, Knoxville, TN (US); Sheng Dai, Knoxville, TN (US); Pasquale F. Fulvio, Oak Ridge, TN (US); Ilia N. Ivanov, Knoxville, TN (US); Nickolay V. Lavrik, Knoxville, TN (US); Panagiotis G. Datskos, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 669 days.

(21) Appl. No.: 13/734,823

(22) Filed: Jan. 4, 2013

(65) Prior Publication Data

US 2013/0174968 A1    Jul. 11, 2013

Related U.S. Application Data

(60) Provisional application No. 61/583,638, filed on Jan. 6, 2012.

(51) Int. Cl.
*C23C 16/26* (2006.01)
*C01B 31/04* (2006.01)
(Continued)

(52) U.S. Cl.
CPC .......... *C01B 31/0453* (2013.01); *B82Y 30/00* (2013.01); *B82Y 40/00* (2013.01);
(Continued)

(58) Field of Classification Search
CPC .... C23C 16/26; C23C 16/4583; C23C 16/545
See application file for complete search history.

(56) References Cited

U.S. PATENT DOCUMENTS 8,075,864 B2 * 12/2011 Choi et al. ............... 423/448
8,470,400 B2    6/2013 Colombo et al.
(Continued)

FOREIGN PATENT DOCUMENTS

CN    102020263    4/2011
CN    102102220    6/2011
(Continued)

OTHER PUBLICATIONS

Bhaviripudi et al. Role of Kinetics in Chemical Vapor Deposition Synthesis of Uniform Large Area Graphene Using Copper Catalyst. Nano Letter, 2010, 10, 4128-4133.*
(Continued)

*Primary Examiner* — David P Turocy
(74) *Attorney, Agent, or Firm* — Warner, Norcross & Judd LLP

(57) ABSTRACT

Systems and methods for synthesizing continuous graphene sheets are provided. The systems and methods include passing a catalyst substrate through a heated chemical vapor deposition chamber and exposing the substrate to a reaction gas mixture of hydrogen and hydrocarbon at a preselected location within the chamber. The reaction gas mixture can include hydrogen having a partial pressure of between about 0 Torr and 20 Torr, hydrocarbon having a partial pressure of between about 20 mTorr and about 10 Torr, and one or more buffer gases. The buffer gases can include argon or other
(Continued)

noble gases to maintain atmospheric pressure within the chemical deposition chamber. The resulting graphene can be made with continuous mono and multilayers (up to six layers) and have single crystalline hexagonal grains with a preselected nucleation density and domain size for a range of applications.

21 Claims, 18 Drawing Sheets

(51) Int. Cl.
  *B82Y 30/00* (2011.01)
  *B82Y 40/00* (2011.01)
  *C01B 32/186* (2017.01)
(52) U.S. Cl.
  CPC ............ *C01B 32/186* (2017.08); *C23C 16/26* (2013.01); *C01B 2204/32* (2013.01); *Y10T 156/10* (2015.01)

(56) References Cited

U.S. PATENT DOCUMENTS

| | | | |
|---|---|---|---|
| 2010/0021708 A1 | 1/2010 | Kong et al. | |
| 2010/0098904 A1 | 4/2010 | Dai et al. | |
| 2011/0143045 A1* | 6/2011 | Veerasamy | 427/495 |
| 2011/0195207 A1* | 8/2011 | Hong et al. | 428/34.1 |
| 2011/0201201 A1 | 8/2011 | Arnold et al. | |
| 2011/0280794 A1 | 11/2011 | Holmes | |
| 2013/0089666 A1* | 4/2013 | Boi et al. | 427/249.1 |

FOREIGN PATENT DOCUMENTS

| | | |
|---|---|---|
| CN | 102127750 | 7/2011 |
| CN | 102134067 | 7/2011 |
| CN | 102191476 | 9/2011 |
| CN | 102212794 | 10/2011 |
| CN | 102220566 | 10/2011 |

OTHER PUBLICATIONS

Vlassiouk et al. Role of Hydrogen in Chemical Vapor Deposition Growth of Large Single-Crystal Graphene. ACSNano, vol. 5, No. 7, 2011, 6069-6076.*
Thorsten Hesjedal. Continuous roll-to-roll growth of graphene films by chemical vapor deposition. Applied Physics Letters 98,2011.*
Losurdo, Maria et al. Graphene CVD growth on copper and nickel: role of hydrogen in kinetics and structure. Phys. Chem. Chem. Phys., 2011, 13, 20836-20843.*
Vlassiouk, et al, "Role of Hydrogen in Chemical Vapor Deposition Growth of Large Single-Crystal Graphene," ANS Nano, vol. 5, Issue 7, pp. 6069-6076, published online Jun. 27, 2011.
PCT Application No. PCT/US2013/23078 International Search Report dated Mar. 19, 2013.
PCT Application No. PCT/US2013/23078 Written Opinion of the International Searching Authority dated Mar. 19, 2013.
Cecco, Alfonso Reina, "Single- and Few-Layer Graphene by Ambient Pressure Chemical Vapor Deposition on Nickel," Massachusetts Institute of Technology, Jun. 2010.
Bhaviripudi, Sreekar et al, "Role of Kinetic Factors in Chemical Vapor Deposition Synthesis of Uniform Large Area Graphene Using Copper Catalyst," Massachusetts Institute of Technology, Web published Sep. 2, 2010.
Dong, Xiaochen, et al "Growth of large-sized graphene thin-films by liquid precursor-based chemical vapor deposition under atmospheric pressure," published in Elsevier, Web published May 7, 2011.
Han, Gang Hee et al, "Influence of Copper Morphology in Forming Nucleation Seeds for Graphene Growth," American Chemical Society Nano Letters, published on Aug. 24, 2011.

* cited by examiner

HIGH QUALITY LARGE SCALE SINGLE AND MULTILAYER GRAPHENE PRODUCTION BY CHEMICAL VAPOR DEPOSITION

This invention was made with government support under Contract No. DE-AC05-00OR22725 awarded by the U.S. Department of Energy. The government has certain rights in the invention.

BACKGROUND OF THE INVENTION

The present invention relates to graphene and, more particularly, to systems and methods for the scalable manufacture of continuous graphene sheets.

Graphene is an individual layer of carbon having a hexagonal bonding structure in a one-atom thick sheet. Graphene is shown to have great potential in a wide range of applications from photovoltaics and electronics to desalination membranes. Despite the well-recognized potential of graphene for numerous applications, a reliable technology for the scaled up production of graphene remains a bottleneck in the transition from graphene research to the development of practically viable graphene devices.

One known technique for graphene production includes chemical vapor deposition (CVD). According to this method, a catalytic substrate is annealed in a reducing atmosphere. After annealing, the catalytic substrate is exposed to a carbon source. A variety of organic gases and solids can be used as a carbon source for graphene growth, with methane gas being a widely used precursor.

Despite the existence of the above method for synthesizing graphene, there remains a continued need for systems and methods for the scalable manufacture of graphene, including continuous graphene sheets. In particular, there remains a continued need for a method of forming continuous graphene sheets having controllable properties, including nucleation density, domain size, and grain structure. The challenges of a low pressure CVD approach include: difficulty in feeding the catalyst foil into a low pressure reactor, severe evaporation of catalyst and requirement of a vacuum system compatible with flammable precursor gases. Presented here, atmospheric pressure CVD is free of these challenges and thus is more suitable for applications in mass production of graphene by CVD.

SUMMARY OF THE INVENTION

Systems and methods for synthesizing single and multi-layer graphene are provided. The systems and methods generally include passing a catalyst substrate through a heated chemical vapor deposition chamber, optionally at atmospheric pressure, and exposing the substrate to a reaction gas mixture including a hydrocarbon (such as methane) and hydrogen. At sufficient partial pressures, hydrogen is a co-catalyst in the formation of active surface bound carbon species, and controls the graphene grain shape and dimension by etching away weak carbon-carbon bonds.

In one embodiment, the reaction gas mixture includes hydrogen having a partial pressure of between about 0 Torr and 50 Torr, methane having a partial pressure of between about 20 mTorr and about 10 Torr, and one or more buffer gases. The buffer gases can include argon or other noble gases to maintain atmospheric pressure within the chemical deposition chamber at a temperature between 700° C. and 1084° C. The resulting monolayer of graphene includes crystal hexagonal grains with a controllable nucleation density and domain size by the choice of temperature and partial pressure of methane and hydrogen.

In another embodiment, alternative heating methods of the catalyst copper foil substrate in the chemical vapor deposition chamber include an infrared lamp, an arc lamp, or an inductive heating element to heat the catalyst to between 700° C. and 1080° C., optionally approximately 1000° C., which can be achieved locally. The chemical vapor deposition chamber additionally includes a deposition region extending across a substantial portion of the width of the chamber. As the heated catalyst substrate passes through the deposition region, the hydrogen and hydrocarbon may intermix to synthesize a continuous layer (single or multi) of graphene on the copper foil. Movement of the catalyst through the deposition region provides an additional control of the grown graphene property, such as growth of continuous multilayers and monolayers ultimately with a single crystal property by "survival" of the fastest growing graphene grains.

Hydrogen serves a dual role in graphene synthesis, functioning as a co-catalyst and also controlling the grain shape and dimension. Graphene nucleation, the growth rate, and the termination size of grains are affected by the competition of these two processes. The present invention can therefore provide improved systems and methods for the scalable production of graphene sheets, optionally at atmospheric conditions. The present invention can facilitate the production of graphene sheets for a wide variety of applications, including large area displays and photovoltaic cells, while also decreasing manufacturing costs and production time.

These and other features and advantages of the present invention will become apparent from the following description of the invention, when viewed in accordance with the accompanying drawings and appended claims.

DETAILED DESCRIPTION OF THE CURRENT EMBODIMENT

I. Overview

The invention as contemplated and disclosed herein includes systems and methods for polycrystalline and single crystals of single and multilayer graphene production by chemical vapor deposition (CVD). As set forth below, the systems and methods include passing a catalyst substrate through a heated chemical vapor deposition chamber and exposing the substrate to a reaction gas mixture of methane and hydrogen, optionally at atmospheric pressure, to achieve continuous single layer and multilayer graphene grains having a desired size, shape and density.

Hydrogen is a co-catalyst in the formation of active surface bound carbon species and controls graphene grain shape and dimension by etching away weak carbon-carbon bonds. By controlling the partial pressure of hydrogen and volatile hydrocarbon (for example, methane), graphene can be synthesized in a scalable process and can have a desired nucleation density and domain size for a variety of applications, including the manufacture of: a) transparent electrodes for photovoltaics, windows, LCD displays, OLED displays, touch screens, and any other application requiring at least one transparent electrode; b) electronic elements, including transistors, photodetectors, and any application requiring high charge carrier mobility; and c) various other applications, including composite materials, membranes for separation, purification, and/or desalination, medical devices, biotechnology, and thermal management.

II. Graphene Synthesis

Figure 1:
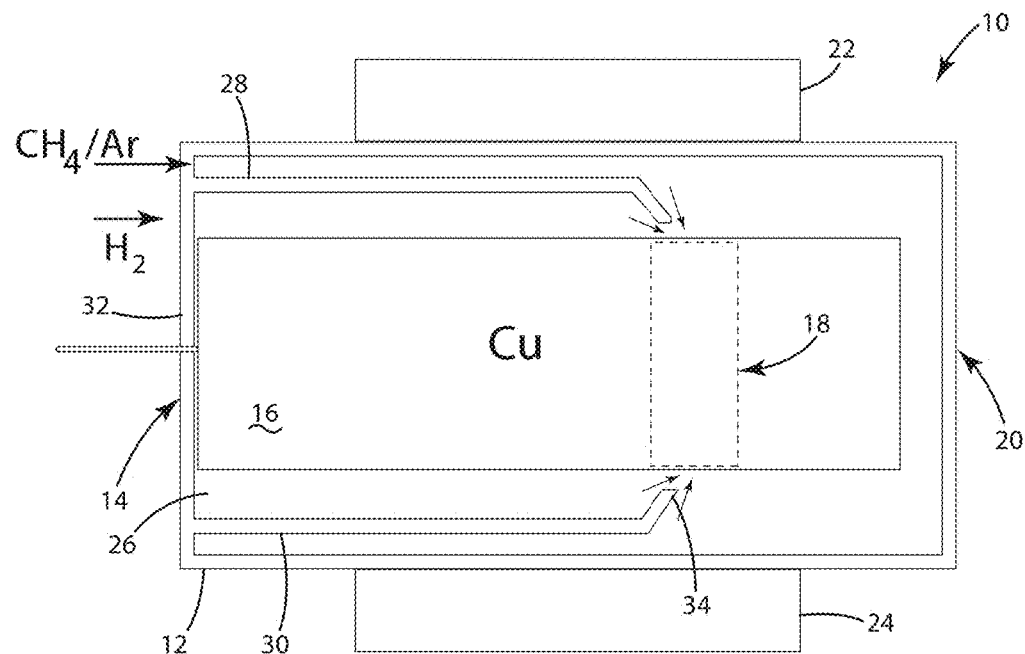
FIG. 1 is a schematic diagram of a chemical vapor deposition chamber for the controlled synthesis of polycrystalline as well as single crystals of single-layer or multi-layer graphene.

Referring now to FIG. 1, a schematic diagram of a chemical vapor deposition chamber in accordance with one embodiment of the present invention is illustrated and generally designated 10. The chemical vapor deposition chamber 10 includes a quartz housing 12 having an inlet 14 for the continuous in-flow of a catalyst substrate 16, an internal deposition region 18, and an outlet 20 for the continuous exit of the catalyst substrate 16 and newly formed graphene layer. External heating elements 22, 24 (e.g., resistive, electromagnetic and/or inductive) heat the catalyst substrate 16 to a preselected temperature within the quartz housing 12. Where the substrate 16 includes a copper foil, the heating elements 22, 24 can heat the copper foil to between about 800° C. and about 1080° C., optionally approximately 1000° C.

As noted above, the chemical vapor deposition chamber 10 includes a deposition region 18 for the controlled formation of graphene on the catalyst substrate 16. The deposition region 18 extends laterally across the width of the catalyst substrate 16 in the present embodiment, being oriented transverse to the moving direction of the catalyst substrate 16. In other embodiments the deposition region 18 is less than the width of the catalyst substrate 16, optionally being focused on a sub-region of the catalyst substrate 16. Within the deposition region 18, a reaction gas mixture interacts with the upward-facing surface of the catalyst substrate 16. The reaction gas mixture includes a hydrocarbon precursor, including methane for example, as well as hydrogen at the desired partial pressures, and a buffer gas. Methane gas can be present in a concentration of about at 30 ppm having a partial pressure of between about 20 mTorr and about 10 Torr, further optionally between about 23 mTorr and about 100 mTorr. Other hydrocarbons can include ethane, propane and butane, for example. Hydrogen gas can have a partial pressure of between about 0 Torr and about 25 Torr, further optionally between about 10 Torr and about 25 Torr, still further optionally between about 12 Torr and about 20 Torr and even further optionally about 19 Torr. Hydrogen having a partial pressure ratio $P_{H2}/P_{CH4}>400$ can result in a distinct hexagonal shape of grains and saturation of their size due to etching of the graphene by hydrogen. The buffer gas can include argon or other noble gas (e.g., helium) to maintain atmospheric pressure within the chemical vapor deposition chamber 10.

The chemical vapor deposition chamber 10 additionally includes a region of no deposition 26. Opposing internal baffles 28, 30 separate the region of no deposition 26 from the remainder of the chamber 10. The opposing baffles 28, 30 extend from an end wall 32 and terminate at a nozzle opening 34 at the deposition region 18. Hydrogen gas (and an optional buffer gas) is fed into the region of no deposition 26 through an opening in the end wall 32 and escapes through the nozzle opening 34. In corresponding fashion, methane gas (and an optional buffer gas) is fed into the deposition chamber 10 outward of the baffles through an opening in the end wall 32. The methane gas intermixes with the hydrogen gas at the nozzle opening 34, which is generally coextensive with the deposition region 18.

Synthesizing graphene using the chemical vapor deposition chamber 10 generally includes passing the continuous copper substrate 16 through the chemical vapor deposition chamber 10, annealing the copper substrate 16 in hydrogen gas, reacting the annealed copper substrate 16 with the reaction gas mixture in the deposition region 18 at substantially atmospheric pressure, and removing the continuous copper substrate 16 and newly formed graphene layer from the chemical vapor deposition chamber 10. Because of the low solubility of carbon in copper, graphene growth is restrained to the surface of the catalyst 16. The newly formed graphene can include a single-atom thick layer or a multi-atom thick layer comprised of multiple single-atom thick layers stacked together, with substantially no graphene growth occurring outside of the deposition region.

Figure 2:
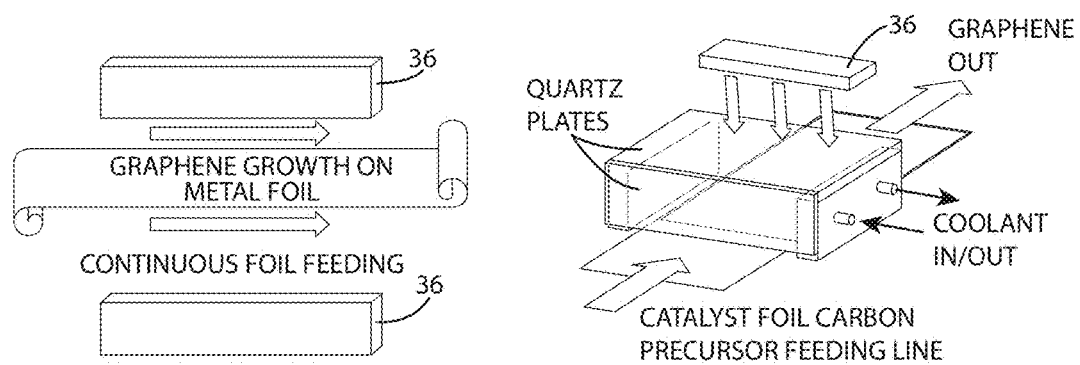
FIG. 2 is a schematic diagram of a chemical vapor deposition chamber including an infrared, plasma arc lamp heater or an induction heater.

As noted above, an external heat source anneals the copper substrate within the chemical deposition chamber 10. The heat source can include resistive elements 22, 24 spaced apart from each other across the width of the chemical deposition chamber 10 as shown in FIG. 1. In other embodiments, one or more infrared or plasma arc lamps 36 are positioned above or on opposing sides of the chemical vapor deposition chamber 10 as shown in FIG. 2. The use of infrared lamps or plasma arc lamps can promote relatively fast graphene growth on dielectric substrates, including polymers for example. Using an infrared lamp or a plasma arc lamp, localized heating of the substrate can be achieved in a very short time frame to thereby decrease processing time. Inductive heating may be used instead of an infrared or a plasma arc lamp.

Figure 3:
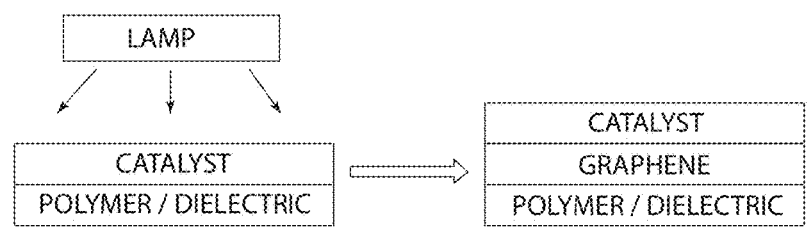
FIG. 3 is a schematic diagram illustrating continuous graphene sheet grown using solid substrate decomposition directly on polymer/dielectric substrates.
Figure 24:
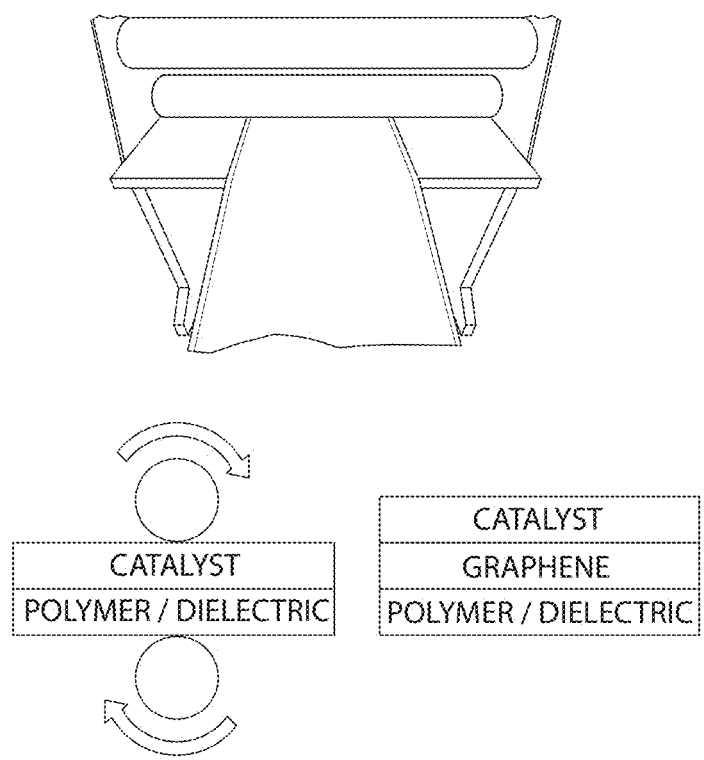
FIG. 24 a schematic diagram illustrating continuous graphene sheet grown using solid substrate decomposition directly on polymer/dielectric substrates.

As also shown in FIG. 3, graphene growth can be performed by solid substrate decomposition directly on polymer/dielectric substrates, eliminating the need for a wet transfer step from the copper catalyst to the substrate of interest. Also by example, graphene can be synthesized on a metal growth substrate and subsequently transferred to a polymer/dielectric as shown in FIG. 24. In this embodiment, a polymer film or a dielectric film can be applied to the graphene layer in a continuous process or in a batch process, resulting in a three-layer device including the metal growth substrate, the graphene layer, and the polymer film or dielectric film. The metal growth substrate is subsequently removed, resulting in a graphene device including only the graphene layer and the polymer/dielectric film.

As set forth in Part III below, graphene growth according to the above method was shown to be strongly dependent on hydrogen, which serves as an activator of surface-bound carbon that leads to monolayer growth and as an etching reagent that controls the size and morphology of the resulting graphene domains. As a consequence, the growth rate has a maximum as a function of hydrogen partial pressure. The morphology and size of these domains change along with that pressure. At very low partial pressures, no graphene growth was observed. At intermediate pressures, near maximal rates of growth, the shapes are not regular with some propensity of 6-fold domains with mostly irregular edges, but sometimes 60 degree edges have been identified. Nearly perfect hexagons were observed at high hydrogen pressures (>10 Torr for 30 ppm of $CH_4$), and their growth ceases at a size which is dependent on the hydrogen pressure.

III. Experimental Data

Graphene was synthesized according to embodiments of the present invention to illustrate grain growth as a function of hydrogen partial pressure, described below with reference to FIGS. 4-10.

Figure 4:
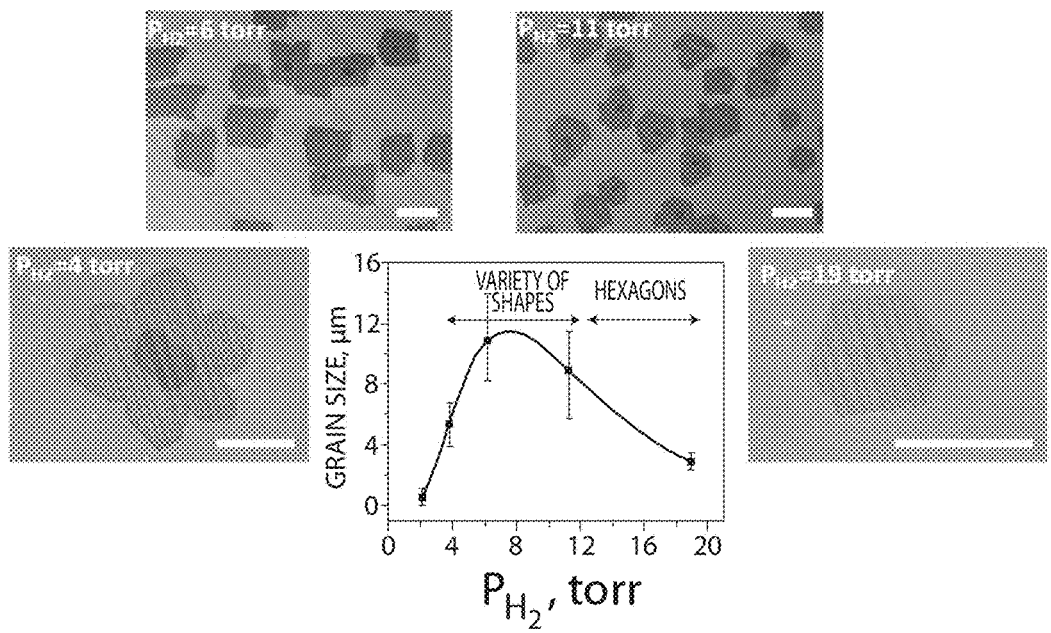
FIG. 4 is a graph and four SEM images illustrating grain formation as a function of the partial pressure of hydrogen.

FIG. 4 includes a graph and four SEM images illustrating an average size of graphene grains grown for 30 minutes at 1000° C. on a copper foil using 30 ppm methane in an argon mixture at 1 atmosphere as a function of partial pressure of hydrogen, with 10 µm scale bars (upper two images) and 3 µm scale bars (lower two images). Samples grown at lower hydrogen pressures of 4 Torr and 6 Torr show relatively irregular-shaped grains, typically with a second layer (and often a third) of smaller areas in the grains' center. As shown in the graph of FIG. 4, hexagonal grains were demonstrated at hydrogen partial pressures of between about 10 Torr and about 20 Torr. For example, the higher hydrogen pressure samples of 11 Torr and 19 Torr demonstrated very regular hexagons with well-identifiable 120° corners. The grains demonstrated an average grain size of about 10 µm for $P_{H2}$ of 11 Torr and about 3 µm for $P_{H2}$ of 19 Torr.

Figure 5:
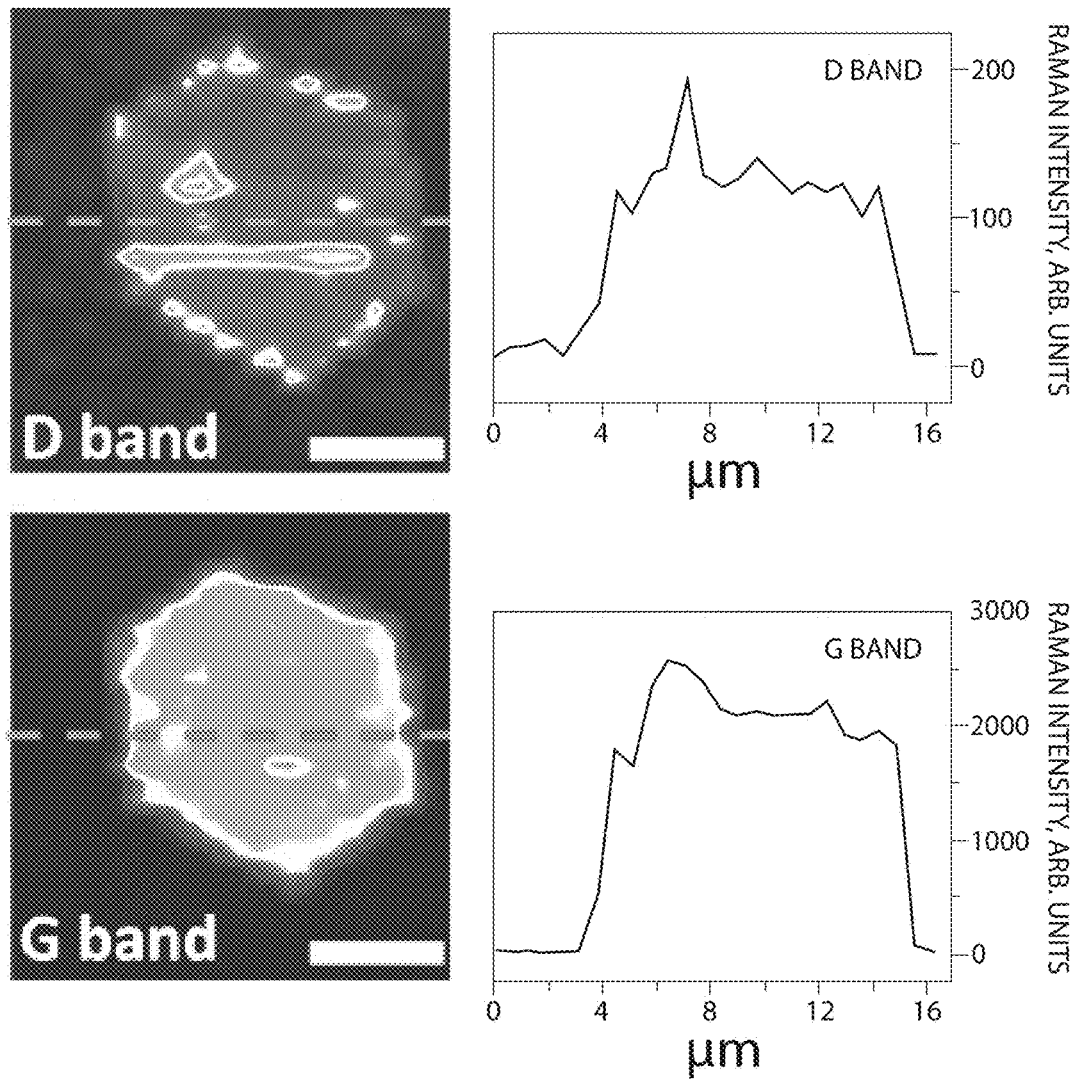
FIG. 5 includes Raman maps of hexagonal grains formed according to the method of the present invention and transferred onto $SiO_2$.

FIG. 5 includes a Raman map of hexagonal grains formed according to the above method and transferred onto $SiO_2$, with 5 µm scale bars. The Raman map shows very small intensity of the D band throughout the hexagonal grain and at the edges, suggesting zigzag termination. Armchair edges have a distinctly higher D band intensity than the zigzag edges because of a lower symmetry of the former. Even though the grains grown at low hydrogen pressures sometimes exhibit lobes with 6-fold symmetry, their edges are poorly defined, suggesting a mixture of zigzag and armchair termination. Nevertheless, the quality of graphene within the irregularly shaped grains remains similarly high as they also show low D band intensities.

Figure 6:
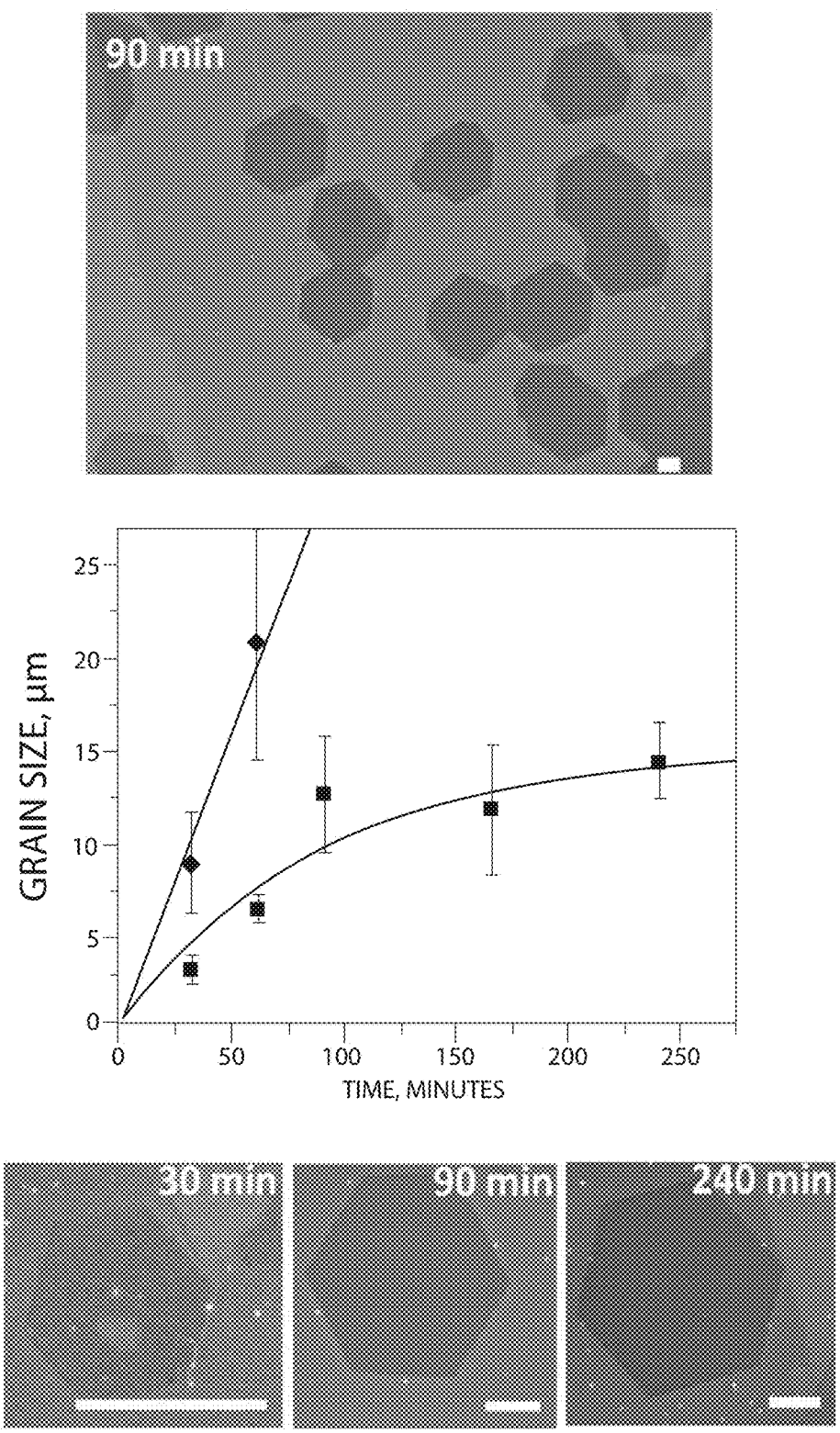
FIG. 6 includes a graph and four SEM images illustrating graphene growth at two representative partial pressures of hydrogen.

FIG. 6 includes a graph and four SEM images illustrating graphene growth at two representative partial pressures of hydrogen, 11 Torr and 19 Torr. The graph depicts the average size of graphene grains as a function of growth time at 1000° C. on copper foil using 30 ppm methane in an argon mixture at one atmosphere, with 3 µm scale bars. Growth times of 30 minutes, 90 minutes and 240 minutes are illustrated. The lower partial pressure of 11 Torr, which corresponds to the near maximum growth rate in FIG. 4, has fewer data points and larger error bars because of higher surface coverage by graphene for these samples; integrain separation restricts the maximum grain size. The higher partial pressure of 19 Torr demonstrates a saturation behavior, where hexagonally-shaped graphene grains ceased to grow beyond about 12 µm (edge to edge).

The graphene grown at different hydrogen pressures illustrates the complex role hydrogen plays in graphene synthesis. Without the presence of hydrogen gas in the reaction mixture, methane has to chemisorb on the copper surface to form active carbon species, that is, $(CH_3)_s$, $(CH)_s$, or $C_s$, which subsequently react to form graphene. As shown experimentally and by DFT calculations, such dehydrogenation reactions are not thermodynamically favorable, even on a copper substrate. For example, the first step of methane dehydrogenation with the formation of the chemisorbed $(CH_3)_s$ radical, shown as reaction (1) below, should overcome a 1.6 eV (~16 kT at 1000° C.) activation barrier with the products being almost 1 eV above the reactants. This endothermic reaction at low methane concentrations should constitute the rate limiting step hindering graphene growth without additional catalysts such as hydrogen. Alternatively, the unfavorable thermodynamics of $(CH_3)_s$ formation might by counteracted by the excessive supply of methane, allowing for graphene formation without hydrogen, but in that rout elimination of the second layer growth seems to be problematic. The catalytic role of hydrogen in activating carbon is illustrated by reactions (1) and (4) below. Molecular hydrogen more readily dissociates on copper and forms active hydrogen atoms (1). These hydrogen atoms can promote activation of physisorbed methane, which is described by reaction (4), and leads to the formation of surface bound $(CH_3)_s$ radicals. Subsequent dehydrogenation steps can lead to formation of more active surface bound species $(CH_2)_s$ and $(CH)_s$.

$$Cu + H_2 \Leftrightarrow 2H_s \quad (1)$$

$$Cu + CH_4 \rightarrow (CH_3)^s + H_s - slow \quad (2)$$

$$Cu + CH_4 \Leftrightarrow (CH_4)_s \quad (3)$$

$$(CH_4)_s + H_s \Leftrightarrow (CH_3)_s + H_2 \quad (4)$$

$$(CH_3)_s + graphene \Leftrightarrow (graphene + C) + H_2 \quad (5)$$

$$H_s + graphene \Leftrightarrow (graphene - C) + (CH_x)_s \quad (6)$$

Active carbon nucleation can occur in copper foils, as well as other metals, including for example Ru. Nucleation occurs on irregularities such as groves on metal foils and surface contamination. The density of graphene grains can be greater on low purity copper than on high purity copper. Since the density of graphene grains and the total coverage near contamination sites is greater than on cleaner areas, desportion/etching of small active carboneous species can play an important part of the overall graphene growth process. Because smaller graphene grains have a higher perimeter to area ratio, they are more vulnerable toward edge etching and, since graphene grain size saturates at high hydrogen partial pressures, hydrogen likely acts not only as a catalyst for carbon activation by dehydrogenation of methane but also participates in controlling the graphene size as depicted in reaction (6). The ultimate grain size at high hydrogen pressure corresponds to equilibrium between graphene growth and etching. The hexagonal shape of graphene under the high hydrogen condition suggests a preference for only one type of grain termination, zigzag, as Raman mapping indicates.

Figure 7:
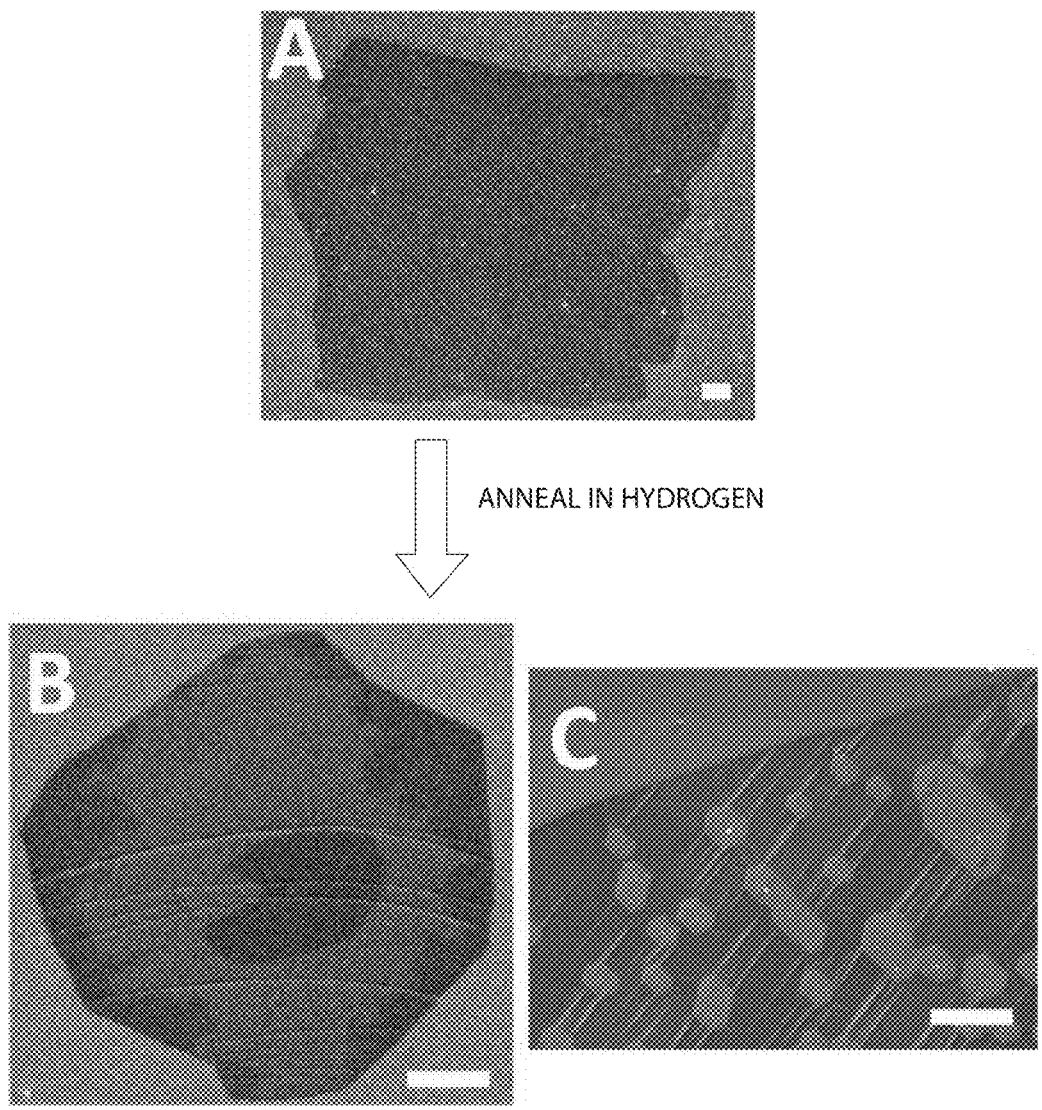
FIG. 7 includes three SEM images illustrating graphene growth after annealing a copper substrate in hydrogen at 19 Torr $P_{H2}$ in 1 atmosphere of argon.

FIG. 7 includes SEM images illustrating graphene growth after annealing a copper substrate in hydrogen at 19 Torr $P_{H2}$ in 1 atmosphere of argon, with 1 μm scale bars. Image A illustrates a single graphene grain grown at 6 Torr $P_{H2}$. Image B illustrates a single graphene grain that has been annealed for 30 minutes immediately after deposition, demonstrating the appearance of 120° angles on the etched edges. Image C illustrates that annealing after taking the sample to ambient atmosphere can deposit dust particles (white spots), which then serve as catalytic centers for etching graphene in the middle.

The etching effect of hydrogen can proceed not only during growth but also during cooling after deposition. Etching noticeably occurs for graphene on copper at least at 850° C., including for example 1000° C. Graphene grown at low hydrogen pressure has irregularly shaped grains but their annealing at 19 Torr of $H_2$ for 30 min produces clearly identifiable 120° edges on a large portion of grains, as shown in image B of FIG. 7. If the annealing is performed after the sample is taken out, some dust particles uncontrollably deposited on the surface become the activation centers of graphene etching. Image C of FIG. 7 illustrates that etching around these particles, appearing as white dots in SEM, proceeds with formation of holes in graphene having a hexagonal shape. Moreover, all of these holes have edges parallel to the outside edges.

Figure 8:
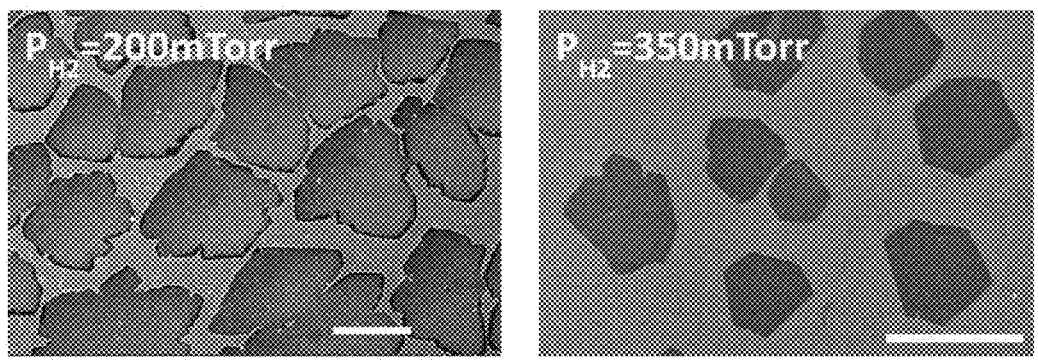
FIG. 8 includes a graph and two SEM images illustrating grain formation as a function of the partial pressure of hydrogen.
Figure 8:
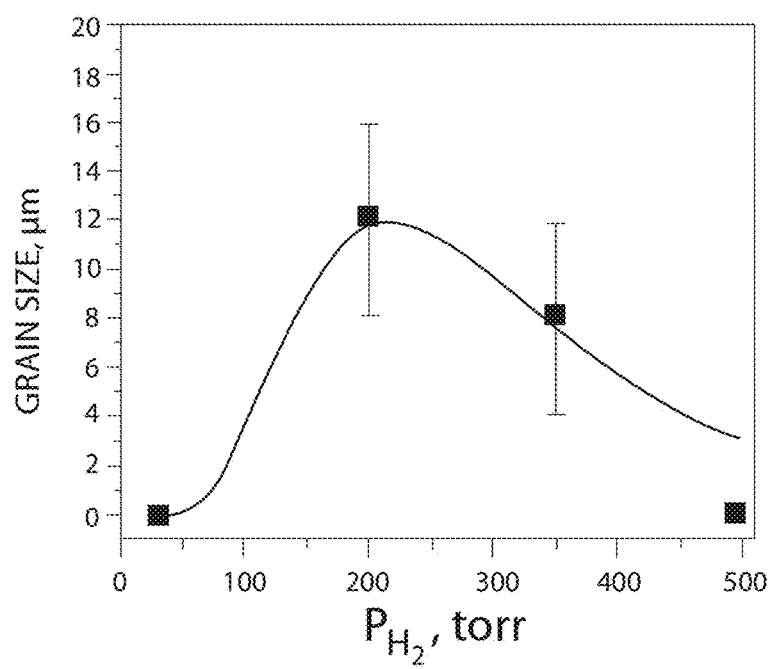

FIG. 8 includes a graph and two SEM images illustrating grain formation as a function of the partial pressure of hydrogen, with 10 μm scale bars. The graphene grains were synthesized 30 minutes in a low pressure chemical vapor deposition chamber at 1000° C. on copper foil using 1 mTorr of methane and different partial pressures of hydrogen, 200 Torr and 350 Torr. Under low-pressure chemical vapor deposition conditions, where no buffer gas is present, the maximum growth rate is observed for a very similar ratio of gases' partial pressures, $PH_2/PCH_4 \approx 200-300$, despite more than an order of magnitude difference in the actual pressures, 23 mTorr (30 ppm) for APCVD (ambient pressure CVD) and 1 mTorr for LPCVD (low pressure CVD).

Figure 9:
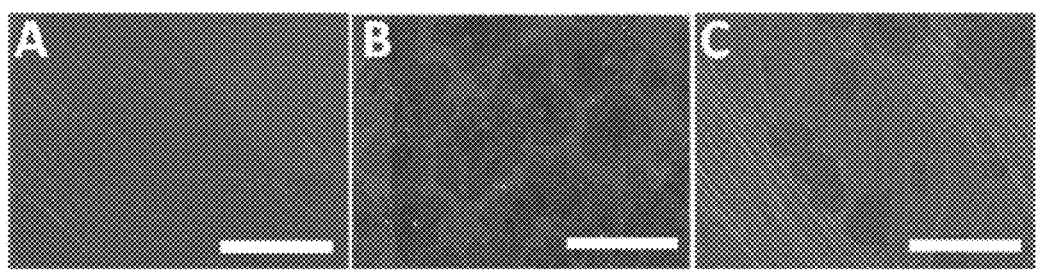
FIG. 9 includes three SEM images illustrating the effect of methane concentrations on graphene synthesis.

FIG. 9 includes three SEM images illustrating the influence of methane concentrations on grain growth, with 10 μm scale bars. Image A includes a continuous single layer at a relatively low methane concentration, 30 ppm, grown for 8 hours. Image B includes a second layer at a higher methane concentration, 150 ppm, also grown for 30 minutes. Image C includes the stepwise increase of methane concentrations from 30 to 150 ppm for a total of 2.5 hours (30 ppm for 90 minutes, 45 ppm for 15 minutes, 60 ppm for 15 minutes, 120 ppm for 15 minutes, and 150 ppm for 15 minutes), producing primarily single layer grains with almost no bilayers. The hydrogen partial pressure remained at 19 Torr in these examples. Even though individual graphene grains saturate in size at high hydrogen pressure in FIG. 4, their density eventually increases enough to connect the grains and cover the whole surface, as shown in FIG. 9, image A. This total coverage is achieved at relatively long growth times. The rate of growth can be accelerated by increasing the methane concentration, which can also promote growth of the second layer (and even greater multilayers), as shown in FIG. 9, image B, for 150 ppm of methane.

Figure 10:
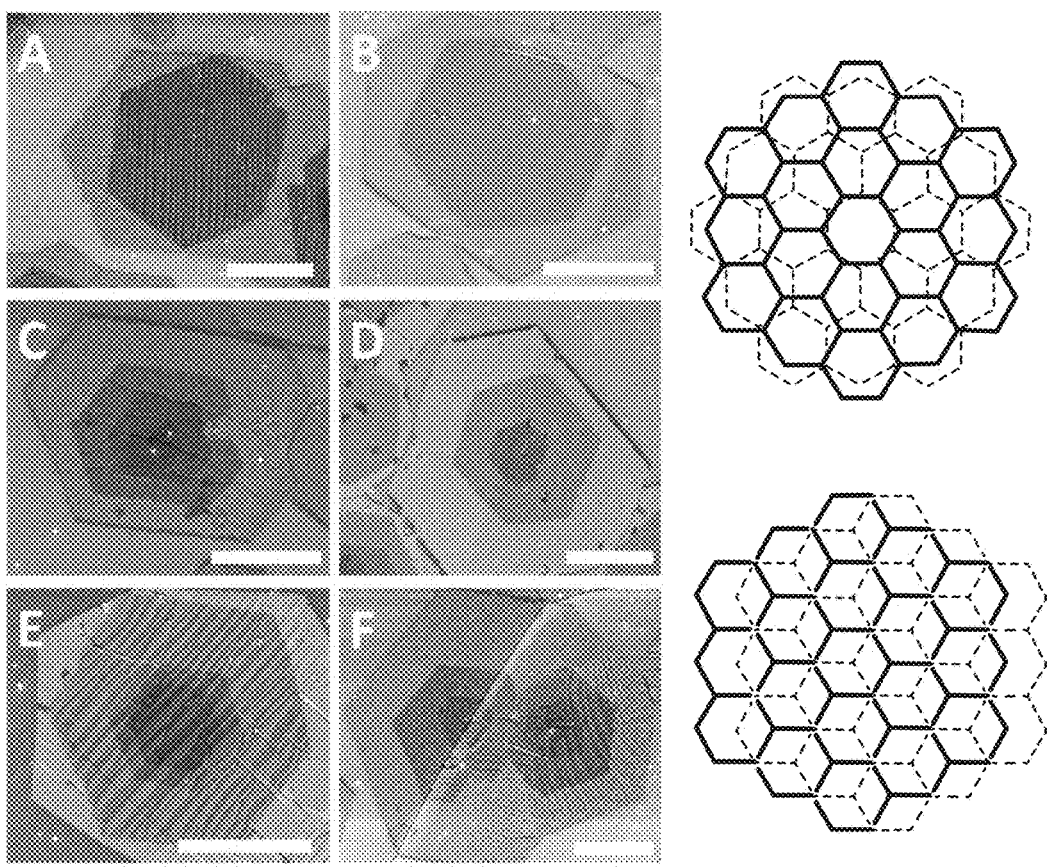
FIG. 10 includes six SEM images and two diagrams illustrating multilayered graphene synthesis.

FIG. 10 includes six SEM images illustrating multilayered graphene growth, with 3 μm scale bars. Multilayered graphene was grown for 30 minutes at 60 ppm methane and 19 Torr of hydrogen partial pressure. All layers are shown to have hexagonal shapes, in contrast to the irregular grains at high concentrations as shown in FIG. 9, image B. The second layer can appear mis-oriented with respect to the first layer, frequently showing thirty-degree rotation (images A, B and E), while some multilayers show AB Bernal stacking (images C and D). The third and fourth layers, however, consistently show AB Bernal stacking (images C, D, E, F).

To reiterate, single-layer single-domain graphene can be grown on copper with a controlled supply of methane and an excess supply of hydrogen (approximately by a factor of 300 at 1000° C.), gradually increasing the supply of methane, either at ambient pressure or low pressure CVD conditions. Hydrogen plays a dual role in the process of graphene growth by CVD on copper foil with methane as a carbon source. Hydrogen acts as a co-catalyst in the formation of active surface bound carbon species $(C_yH_x)$s required for graphene growth and controls the grains' shape and dimension by etching away the "weak" carbon-carbon bonds. Graphene nucleation, the growth rate, and the termination size of grains are affected by competition of these two processes. No graphene growth was observed at low partial hydrogen pressures (<2 Torr with 30 ppm of $CH_4$ and Ar buffer at ambient pressure, that is, $PH_2/PCH_4 < 20$) on clean surfaces due to the rate limiting step of methane activation (2), which is thermodynamically unfavorable. At higher hydrogen pressures, hydrogen atoms produced on the copper surface assist in generation of active carbon species (4) required for graphene growth (5). At intermediate hydrogen partial pressures (P=2 to 11 Torr, that is, $PH_2/PCH_4 \approx 200$ to 400), graphene grains showed a variety of shapes without any recognized preference toward either zigzag or armchair termination. Higher hydrogen pressures (P=19 Torr, that is, $PH_2/PCH_4 > 400$) resulted in distinct hexagonal shape of grains and saturation of their size due to etching of the graphene by hydrogen (6). Raman intensity mapping suggests preferential zigzag terminations of such hexagons in line with their predicted lower energy. Elevated methane concentrations tended to promote formation of multilayers; the shape of grains for which are similarly dependent on hydrogen but their coverage was less than 100%. Hexagonal multilayers had commensurate AB Bernal stacking between the second and higher layers but the mutual orientation of the first two layers was random.

IV. Example

Graphene was synthesized according to the following method, described with reference to FIGS. 11-23, which is intended to be non-limiting.

Two copper substrates having different purities were employed in the chemical vapor deposition synthesis of graphene: a "low" purity copper foil (#13382, 99.8%) and a "high" purity copper foil (#10950, 99.999%) available from Alfa Aesar. The foils were cleaned with acetone, isopropyl alcohol (IPA), deionized (DI) water, and IPA again. Additional cleaning by diluted (1%) $HNO_3$ did not produce any changes in graphene growth appearance. Chemical vapor deposition growth under ambient pressure was performed in a quartz tube with a total gas flow of 500 sccm (standard cubic centimeters per minute). The desired partial pressures of $H_2$ and $CH_4$ were achieved by mixing the stock gas mixtures of 2.5% $H_2$ and 0.1% $CH_4$ in high purity argon. The foils were heated to 1000° C. in the hydrogen stock mixture (2.5% $H_2$ in Ar) with the rate of 10° C./min and annealed for one hour with the subsequent graphene growth at 1000° C. upon adding the methane stock mixture (0.1% $CH_4$ in Ar) to a desired proportion for a chosen time. Samples were fast cooled to room temperature in the same mixture but without methane flow. For LPCVD growth, the pressure was lowered to below 500 mTorr. Methane partial pressure was kept at 1 mTorr, and the hydrogen partial pressure was systematically varied. For Raman characterization, graphene was transferred onto a 300 nm $SiO_2$/Si wafer using spin-coated PMMA (~500 nm thick) with its subsequent dissolution in acetone. Raman spectra were obtained with 633 nm laser excitation using a Renishaw confocal instrument.

FIGS. 11-23 include graphics and SEM images illustrating: (a) the mutual orientation of graphene grains; (b) the effect of copper purity and surface morphology on the graphene nucleation density; (c) the effect of the buffer gas; (d) the effect of hydrogen partial pressure and methane partial pressure on the shape and morphology of graphene grains; and (e) Raman spectra for monolayers grown at the conditions for hexagonal and irregularly shaped graphene grains.

Figure 11A:
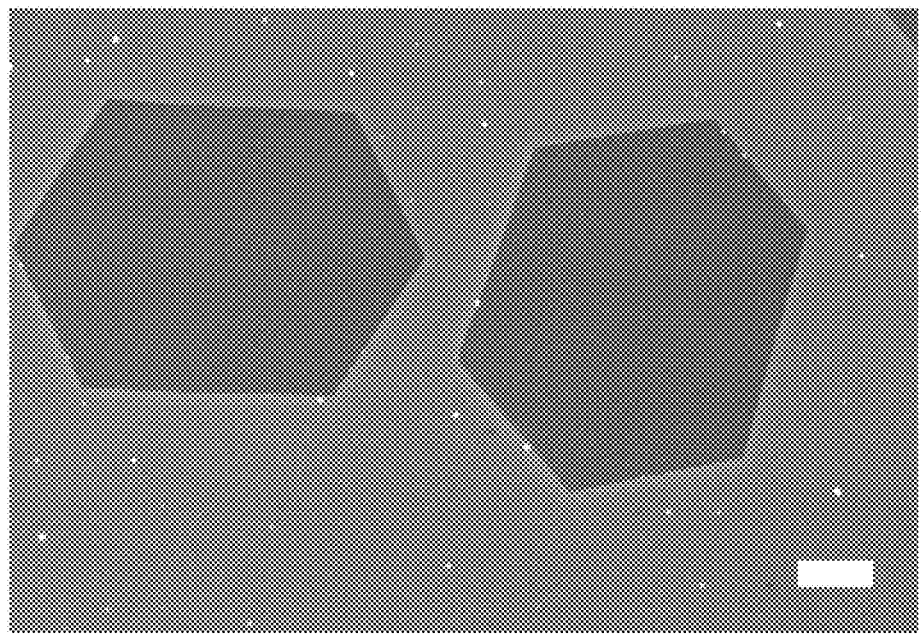
FIGS. 11A and 11B include SEM images illustrating the orientation of graphene grains is not strongly controlled by the underlying copper substrate.
Figure 11B:
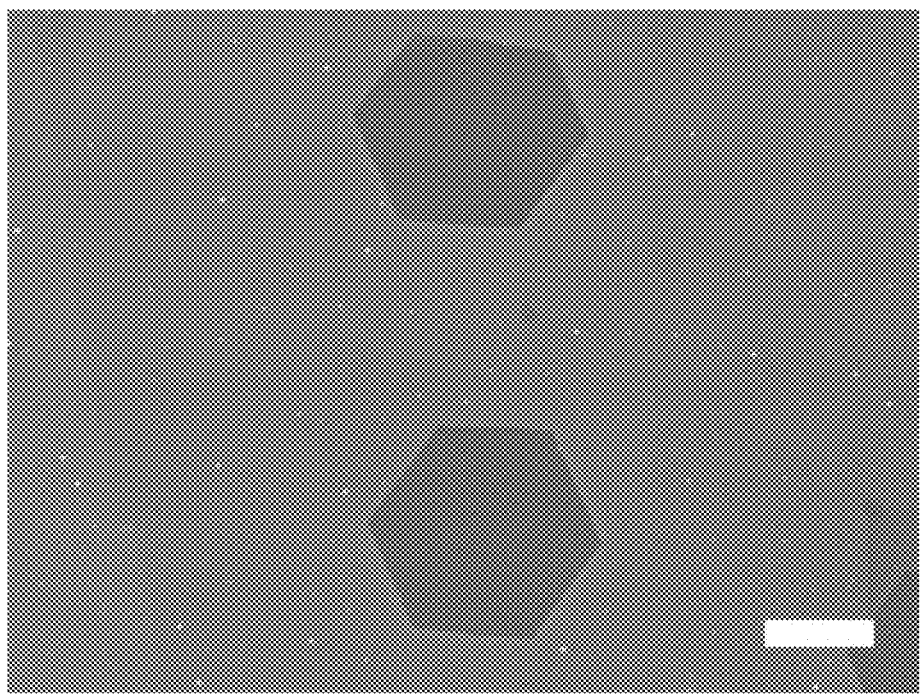
Figure 12:
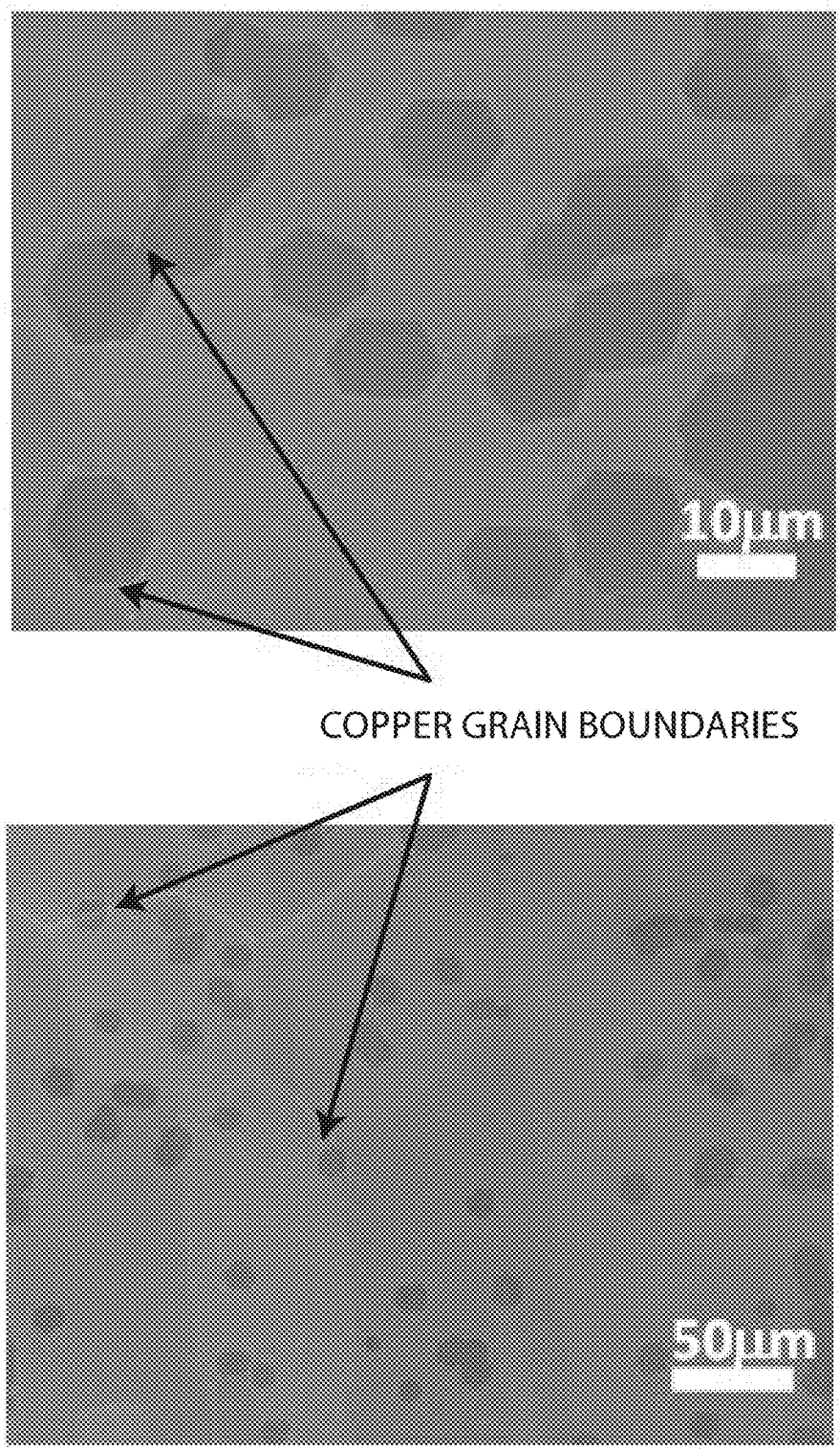
FIG. 12 includes two SEM images illustrating graphene grain growth over copper domains.
Figure 13A:
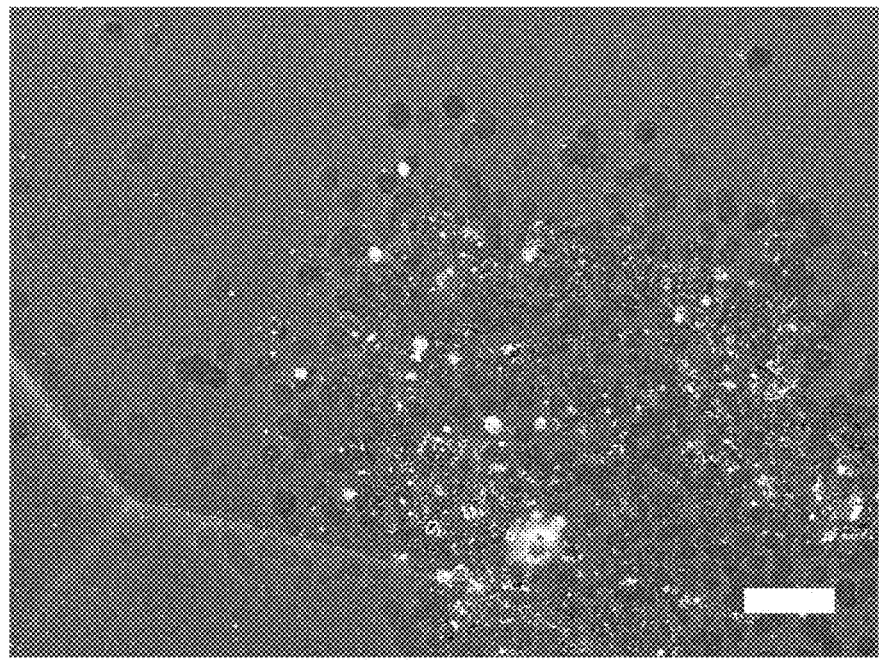
FIGS. 13A and 13B include SEM images illustrating nucleation sites of graphene grains on a copper foil.
Figure 13B:
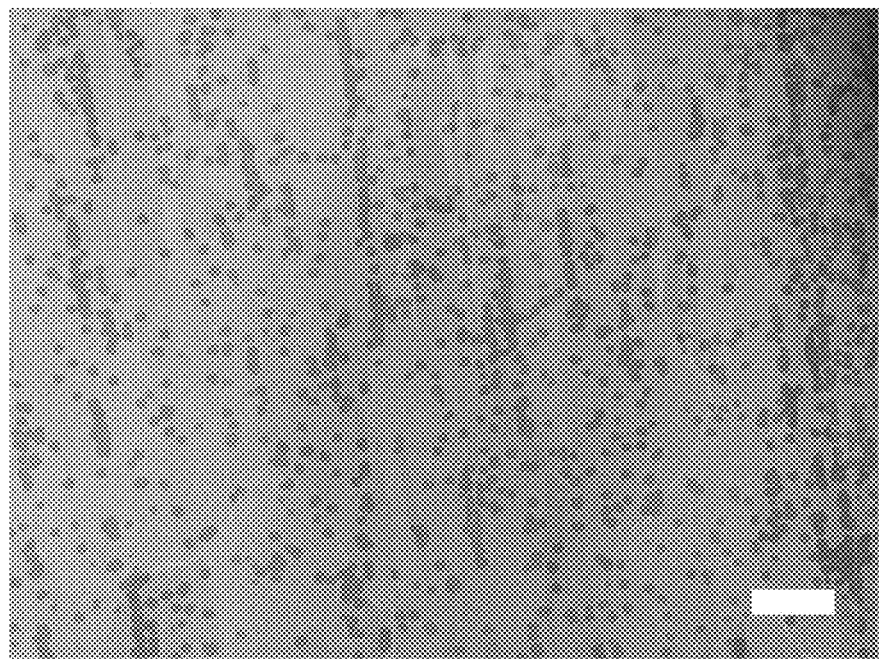
Figure 14:
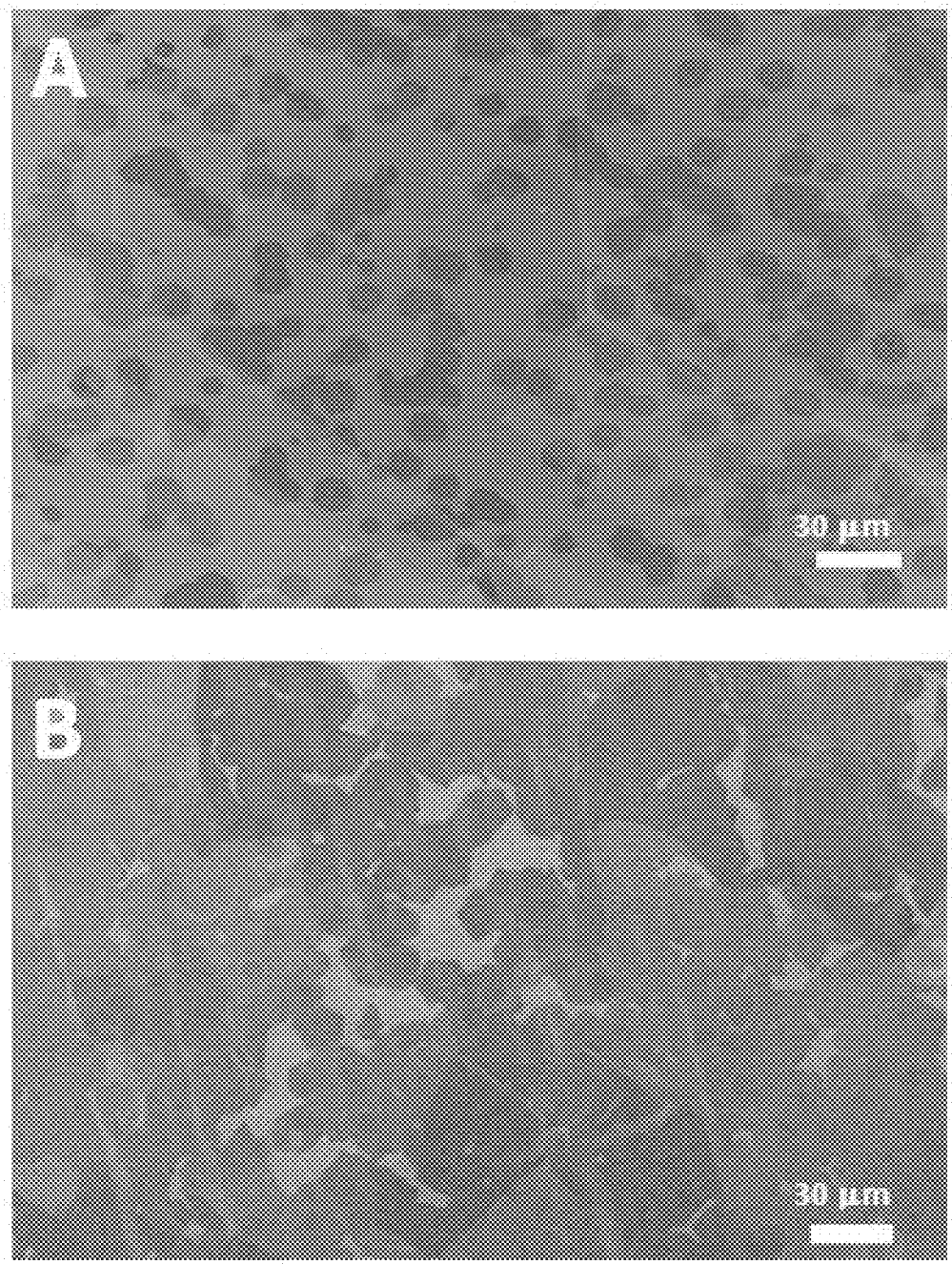
FIG. 14 includes two SEM images illustrating different graphene grain densities on high and low purity copper foils.
Figure 15:
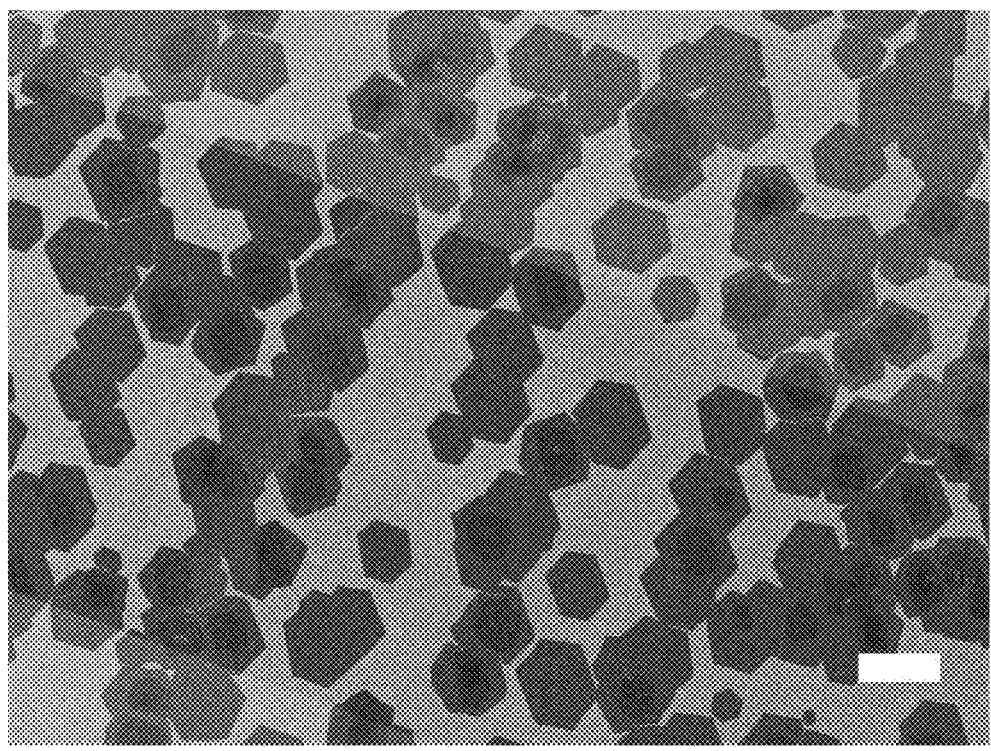
FIG. 15 includes an SEM image illustrating hexagonal graphene grains using helium as a carrier gas.
Figure 16:
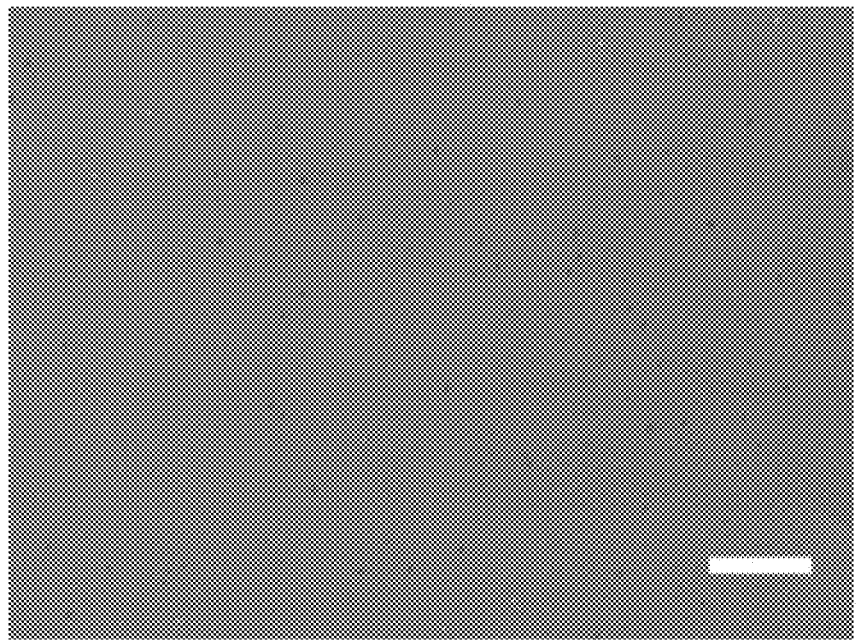
FIG. 16 includes an SEM image of graphene grains grown at a hydrogen partial pressure of 2.1 Torr.
Figure 17:
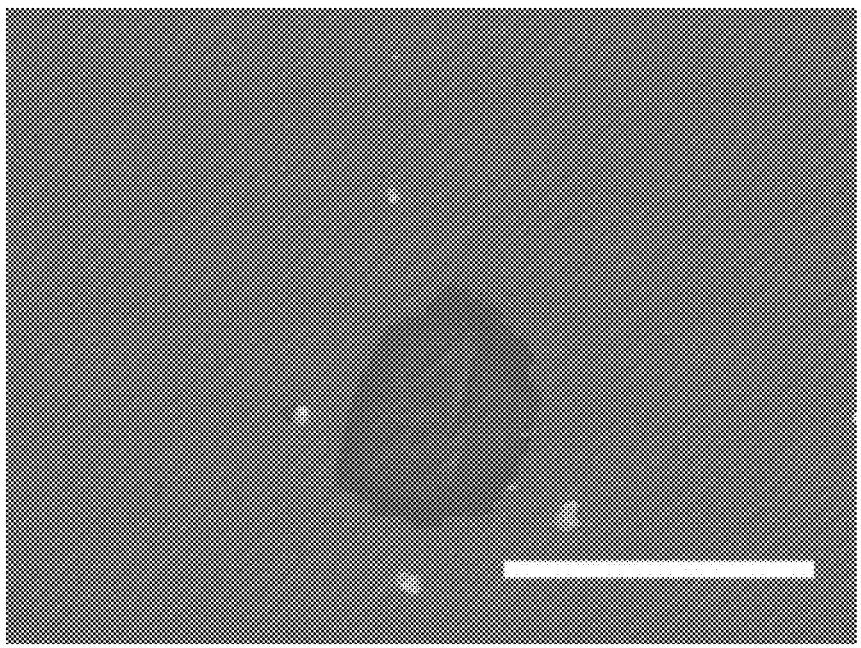
FIG. 17 includes an SEM image of graphene grains grown at a hydrogen partial pressure of 2.1 Torr.
Figure 18:
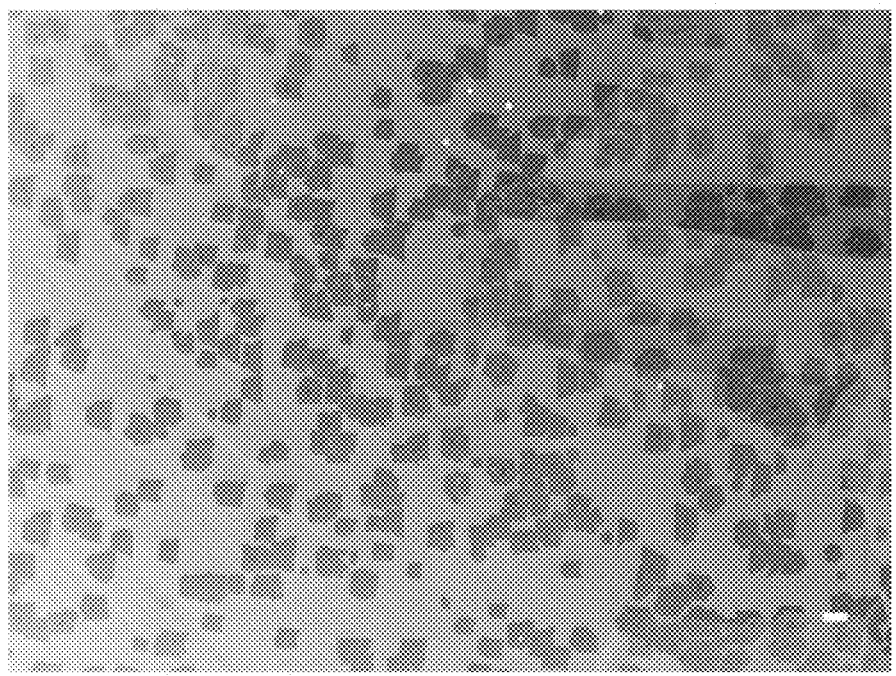
FIG. 18 includes an SEM image of graphene grains grown at a hydrogen partial pressure of 6.2 Torr.
Figure 19:
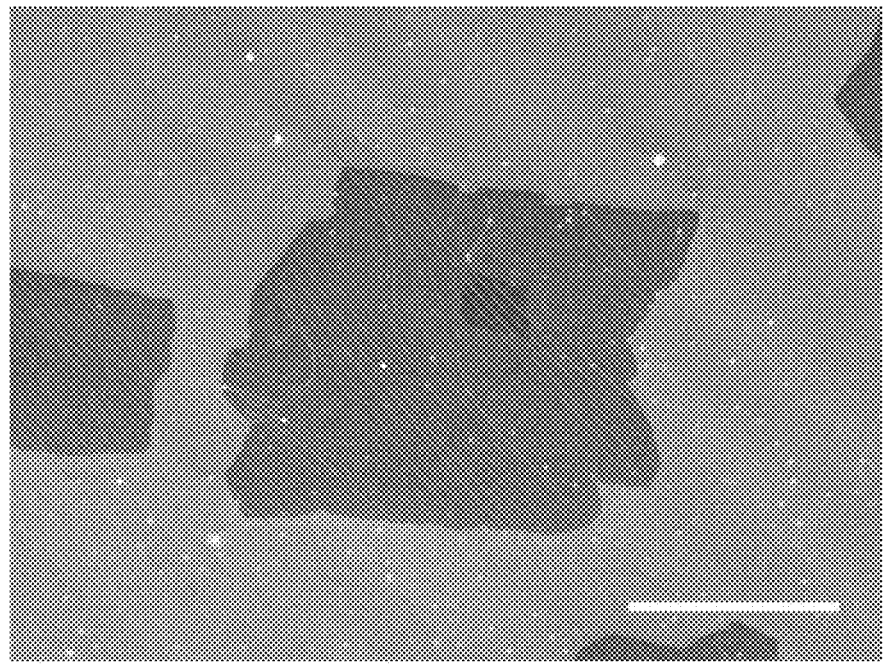
FIG. 19 includes an SEM image of graphene grains grown at a hydrogen partial pressure of 6.2 Torr.
Figure 20:
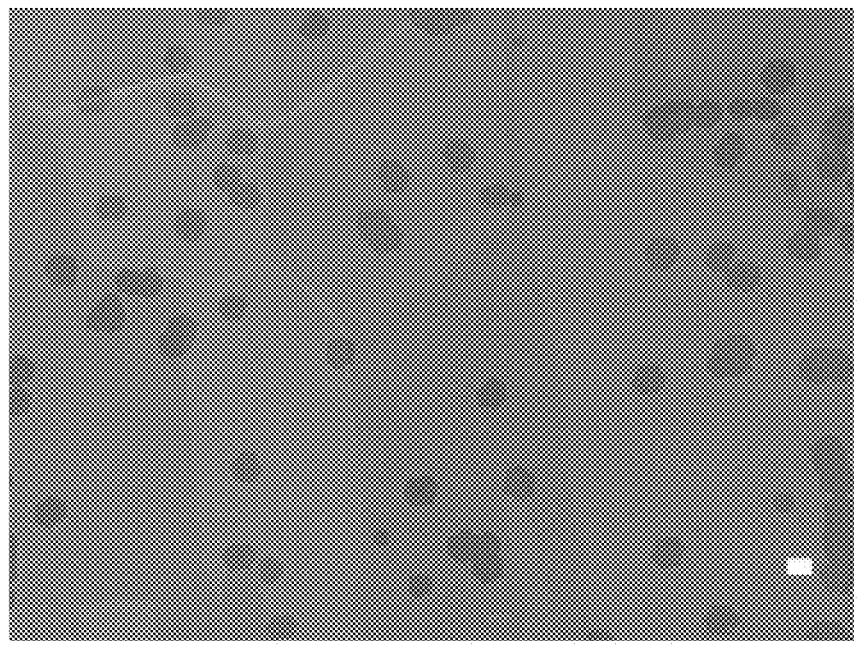
FIG. 20 includes an SEM image of graphene grains grown at a hydrogen partial pressure of 19 Torr.
Figure 21:
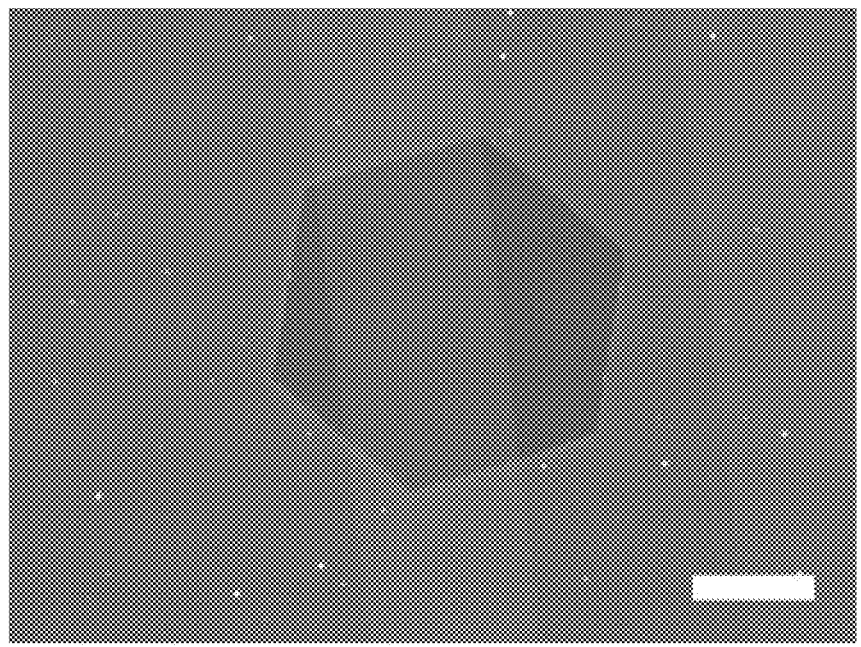
FIG. 21 includes an SEM image of graphene grains grown at a hydrogen partial pressure of 19 Torr.

In particular, FIG. 11A is an SEM image showing that the orientation of graphene grains is not strongly controlled by the underlying copper substrate, suggesting a weak bonding between them, as the two graphene grains have different orientations. FIG. 11B is an SEM image showing that, in contrast to FIG. 11A, other graphene grains on the same copper grain have similar orientations. FIG. 12 is an SEM image showing that graphene grains can grow over the copper domain, which corroborates their weak binding to the substrate. FIG. 13A is an SEM image of nucleation sites of graphene grains that appear to increase at the regions with clearly recognizable impurities or at more subtle sites, which are believed to be the processing grooves on copper foils that form a line pattern. FIG. 13B is an SEM image similar to FIG. 13A, but at a lower magnification to illustrate the line pattern. FIG. 14 includes a pair of SEM images showing different graphene densities on (A) "high" purity copper and (B) "low" purity copper, simultaneously grown for 2.5 hours at ambient pressure at $P_{H2}$=19 Torr and 30 ppm $CH_4$. High nucleation density on the "low" purity copper foil is likely due to impurities as well as different surface roughness and morphology. FIG. 15 includes an SEM image showing hexagonal graphene grains using He as a carrier gas. High density of bilayers is due to a high $CH_4$ flow at the beginning of the growth. Conditions for growth included 2.5% $H_2$/He and 45 ppm of $CH_4$ for 60 minutes. FIGS. 16-17 include SEM images of graphene grains grown at $P_{H2}$=2.1 Torr, showing very small grains, FIGS. 18-19 include SEM images of graphene grains grown at $P_{H2}$=6.2 Torr, showing large grains, mostly of irregular shapes, and FIGS. 20-21 include SEM images of graphene grains grown at $P_{H2}$=19 Torr, showing a distinct hexagonal grain shape.

Figure 22:
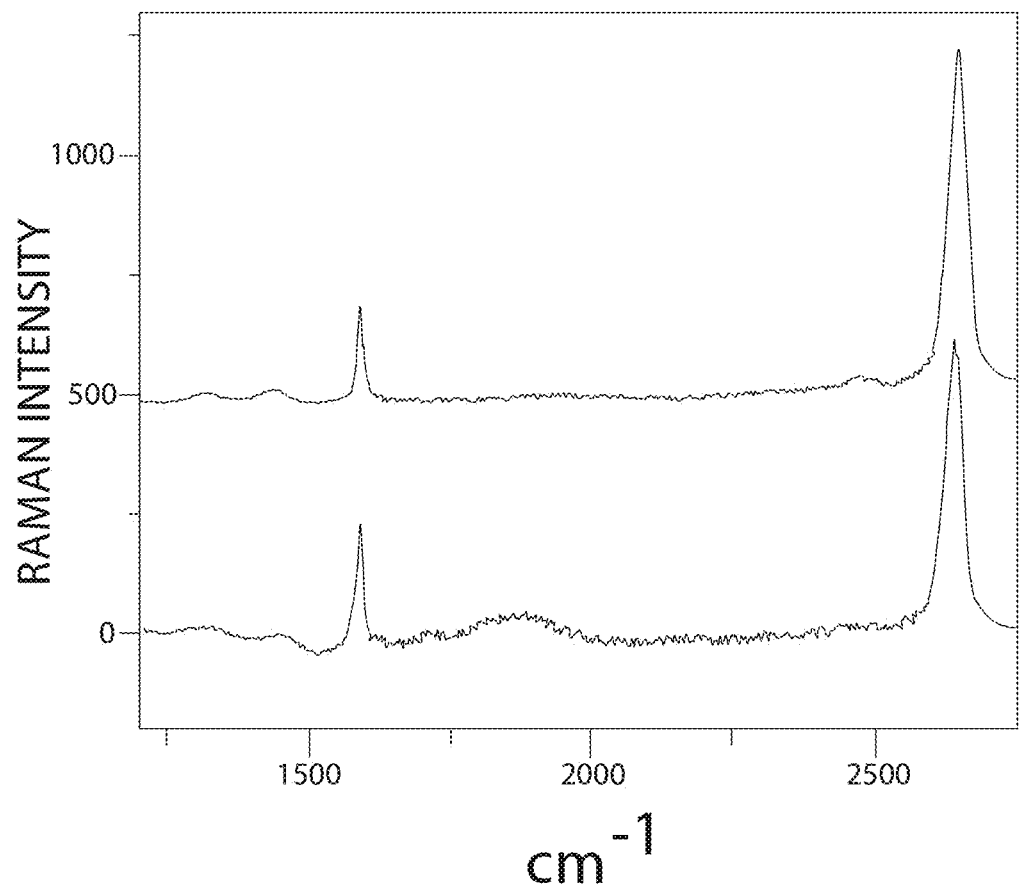
FIG. 22 is a graph illustrating Raman spectra of graphene transferred onto a $SiO_2$/Si wafer.
Figure 23:
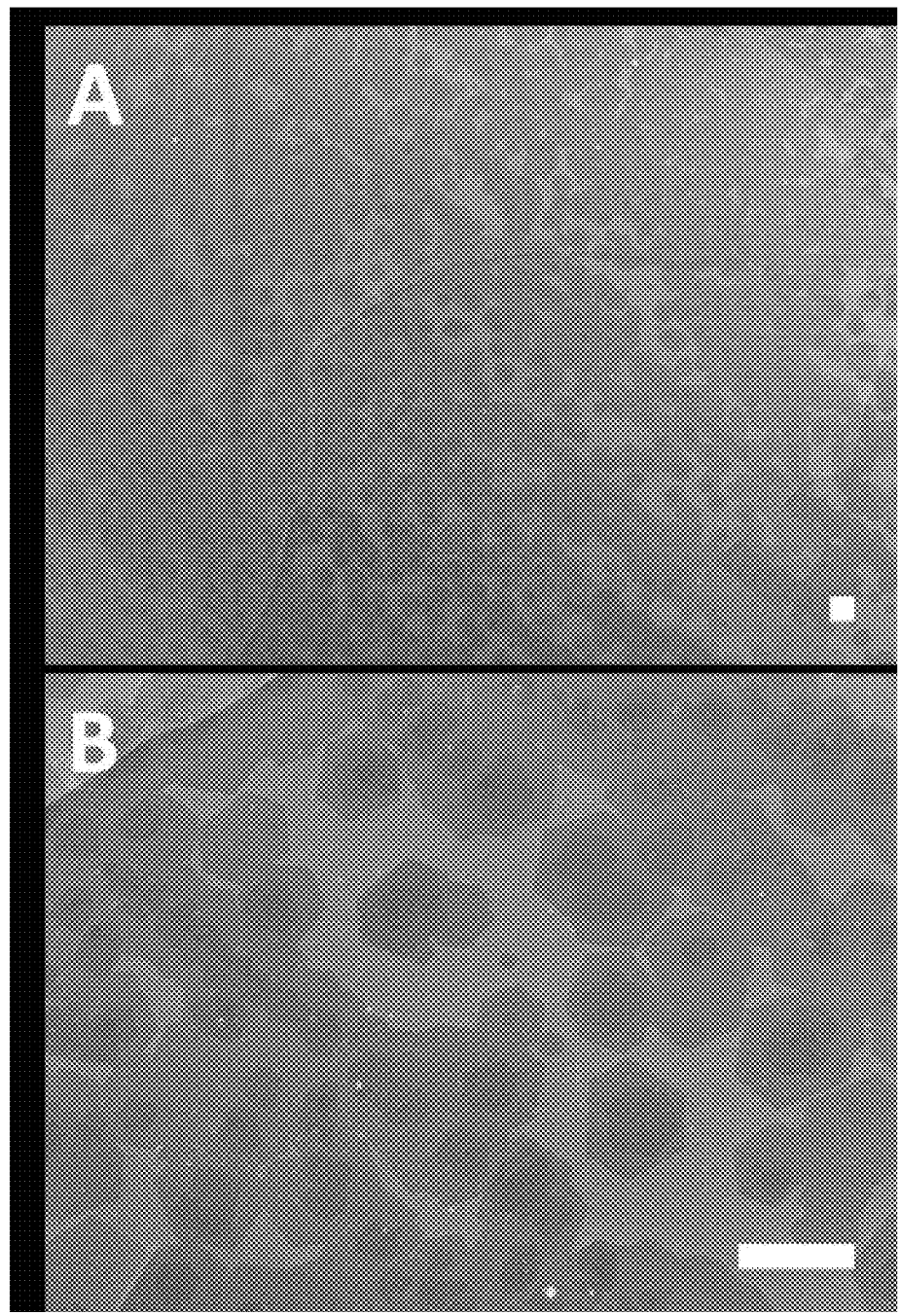
FIG. 23 includes two SEM images of multilayered graphene grains grown for 30 minutes under 80 ppm of $CH_4$ and a hydrogen partial pressure of 19 Torr.

FIG. 22 includes a graph showing Raman spectra of graphene transferred into $SiO_2$/Si wafer, where the lower line corresponds to graphene synthesized at $P_{H2}$=19 Torr for hexagonal grain growth, and the upper line corresponds to graphene synthesized for irregularly shaped grain growth. FIG. 23 includes a pair of SEM images of multilayered graphene grains grown for 30 minutes under 80 ppm $CH_4$ and 19 Torr $H_2$ with Ar as a buffer gas. Accordingly, the first, second and third layers of graphene are mostly of hexagonal shape.

The above description is that of current embodiments of the invention. Various alterations and changes can be made without departing from the spirit and broader aspects of the invention as defined in the appended claims, which are to be interpreted in accordance with the principles of patent law including the doctrine of equivalents. Any reference to elements in the singular, for example, using the articles "a," "an," "the," or "said," is not to be construed as limiting the element to the singular.

The invention claimed is:

1. A method of making a monolayer or multilayer of poly-crystalline and single crystalline graphene comprising:
    providing a chemical vapor deposition chamber including a pre-deposition region and a deposition region in fluid communication with each other at atmospheric pressure;
    providing a continuous copper substrate for movement through the chemical vapor deposition chamber;
    drawing the copper substrate through the pre-deposition region of the chemical vapor deposition chamber at atmospheric pressure and in the presence of hydrogen gas to anneal the copper substrate;
    introducing a hydrocarbon gas and a buffer gas at a nozzle opening coextensive with the deposition region of the chemical vapor deposition chamber to mix with hydrogen gas escaping from the pre-deposition region at the nozzle opening, thereby forming a reaction gas mixture in the deposition region, the reaction gas mixture being at atmospheric pressure;
    drawing the copper substrate through the deposition region of the chemical vapor deposition chamber while introducing the hydrocarbon gas at the nozzle opening so that the copper substrate continuously reacts with the reaction gas mixture in the deposition region, the reaction gas mixture having a partial pressure of hydrogen gas at 10-20 Torr and a partial pressure of hydrocarbon gas at 23-100 mTorr with a ratio of hydrogen gas partial pressure to hydrocarbon gas partial pressure of greater than 400 to form a monolayer or multilayer of graphene including crystal hexagonal grains, wherein the hydrogen gas contributes to the annealing of the copper substrate in the pre-deposition region and contributes to the formation of active surface-bound carbon species in the deposition region; and
    continuously extracting the copper substrate from the chemical vapor deposition chamber, the extracted copper substrate supporting the monolayer or multilayer of graphene including crystal hexagonal grains.

2. The method according to claim 1 wherein the hydrocarbon gas includes about 30 ppm methane gas.

3. The method according to claim 1 further including continuously extracting the copper substrate from the chemical vapor deposition chamber with a poly-crystalline or single-crystalline graphene.

4. The method according to claim 1 wherein the hexagonal grains have an average grain size of between about 3 μm and about 1000 μm.

5. The method according to claim 1 wherein the number of continuous multilayers of graphene is between 2 and 6.

6. The method according to claim 1 further including heating the copper substrate to approximately 1000° C. using an infrared or plasma arc lamp.

7. The method according to claim 1 further including heating the copper substrate using inductive coils.

8. A method of synthesizing graphene comprising:
providing a chemical vapor deposition chamber including a pre-deposition region and a deposition region in fluid communication with each other at atmospheric pressure;
providing a continuous catalyst substrate for movement through the chemical vapor deposition chamber;
annealing the catalyst substrate in hydrogen gas within the pre-deposition region of the chemical vapor deposition chamber at atmospheric pressure and in the presence of hydrogen gas while passing the catalyst substrate therethrough;
introducing a hydrocarbon gas and a buffer gas at a nozzle opening coextensive with the deposition region of the chemical vapor deposition chamber to mix with hydrogen gas escaping from the pre-deposition region at the nozzle opening, thereby forming a reaction gas mixture in the deposition region, the reaction gas mixture being at atmospheric pressure;
drawing the catalyst substrate through the deposition region of the chemical vapor deposition chamber while introducing the hydrocarbon gas at the nozzle opening so that the annealed catalyst substrate continuously reacts with the reaction gas mixture, the reaction gas mixture having a partial pressure of the hydrocarbon gas between about 23 mTorr and about 100 mTorr, and having a partial pressure of the hydrogen gas between about 10 Torr and about 20 Torr with a ratio of hydrogen gas partial pressure to hydrocarbon gas partial pressure of greater than 400, wherein the hydrogen gas contributes to the annealing of the catalyst substrate in the pre-deposition region and contributes to the formation of active surface-bound carbon species in the deposition region; and
continuously extracting the catalyst substrate from the chemical vapor deposition chamber, the extracted catalyst substrate supporting a monolayer or multilayer of graphene including crystal hexagonal grains.

9. The method according to claim 8 wherein the hydrocarbon gas is selected from the group consisting of methane, ethane, propane, butane, pentane, hexane, heptane, octane, benzene, toluene and combinations thereof.

10. The method according to claim 8 wherein the catalyst substrate includes a copper foil.

11. The method according to claim 8 wherein annealing the catalyst substrate includes gradually heating the catalyst substrate to approximately 1000° C.

12. The method according to claim 11 wherein heating the catalyst substrate is performed using one of a plasma arc lamp, a resistive furnace, an infrared lamp and an inductive coil.

13. The method according to claim 8 wherein the buffer gas includes helium to maintain atmospheric pressure within the chemical vapor deposition chamber.

14. The method according to claim 8 further including bonding the synthesized graphene to a polymeric or dielectric substrate.

15. The method according to claim 14 further including separating the catalyst substrate after bonding the synthesized graphene to the polymeric or dielectric substrate.

16. A method of synthesizing graphene:
providing a chemical vapor deposition chamber including a pre-deposition region and a laterally-extending deposition region in fluid communication with each other at atmospheric pressure;
passing a continuous copper substrate through the pre-deposition region of the chemical vapor deposition chamber at atmospheric pressure;
annealing the copper substrate within the pre-deposition region of the chemical vapor deposition chamber in $H_2$ gas while drawing the copper substrate therethrough;
introducing a hydrocarbon gas and a buffer gas at a nozzle opening coextensive with the deposition region of the chemical vapor deposition chamber to mix with hydrogen gas escaping from the pre-deposition region at the nozzle opening, thereby forming a reaction gas mixture in the deposition region, the reaction gas mixture being at atmospheric pressure;
passing the annealed copper substrate through the deposition region of the chemical vapor deposition chamber while introducing the hydrocarbon gas at the nozzle opening so that the copper substrate continuously reacts with the reaction gas mixture in the deposition region to form poly-crystalline or single-crystalline graphene on the annealed copper substrate, the hydrocarbon gas having a partial pressure between about 23 mTorr and about 100 mTorr, the $H_2$ gas having a partial pressure between about 10 Torr and about 20 Torr with a ratio of $H_2$ gas partial pressure to hydrocarbon gas partial pressure of greater than 400, wherein the $H_2$ gas contributes to the annealing of the copper substrate in the pre-deposition region and contributes to the formation of active surface-bound carbon species in the deposition region; and
continuously extracting the copper substrate from the chemical vapor deposition chamber, the extracted copper substrate supporting a monolayer or multilayer of graphene including crystal hexagonal grains.

17. The method according to claim 16 further including continuously extracting the copper substrate with poly-crystalline or single-crystalline graphene from the chemical vapor deposition chamber.

18. The method according to claim 16 wherein annealing the copper substrate includes gradually heating the copper substrate to approximately 1000° C.

19. The method according to claim 16 wherein the annealed copper substrate is exposed to hydrocarbon gas for at least 5 minutes before removal from the chemical vapor deposition chamber.

20. The method according to claim 16 wherein the hexagonal grains having an average grain size between about 3 μm and about 20 μm.

21. The method according to claim 16 wherein the hydrocarbon gas is selected from the group consisting of $CH_4$, $C2H_6$, $C_3H_8$, and $C_4H_{10}$.

* * * * *